United States Patent [19]

Ong et al.

[11] Patent Number: 5,736,949
[45] Date of Patent: Apr. 7, 1998

[54] MULTIPLEXED ANALOG-TO-DIGITAL CONVERTER FOR RELATIVE AND ABSOLUTE VOLTAGE MEASUREMENTS

[75] Inventors: Eng Yue Ong; Alvin Liw Sioee Hock; Geng Xia, all of Singapore, Singapore

[73] Assignee: Tritech Microelectronics International Pte, Ltd., Singapore, Singapore

[21] Appl. No.: 785,735

[22] Filed: Jan. 17, 1997

[51] Int. Cl.$^6$ ................................................ H03M 1/34
[52] U.S. Cl. ........................ 341/141; 341/155; 324/76.59
[58] Field of Search ............................ 341/141, 155; 324/76.59

[56] References Cited

U.S. PATENT DOCUMENTS

| | | | |
|---|---|---|---|
| 5,231,398 | 7/1993 | Topper | 341/156 |
| 5,568,148 | 10/1996 | Furukawa et al. | 341/155 |
| 5,611,624 | 3/1997 | Tornare | 374/179 |
| 5,673,046 | 9/1997 | Hirajima et al. | 341/159 |

Primary Examiner—Jeffrey A. Gaffin
Assistant Examiner—Peguy Jean-Pierre
Attorney, Agent, or Firm—George O. Saile; Stephen B. Ackerman

[57] ABSTRACT

A multiplexed analog-to-digital converter to accept multiple dissimilar analog input signals and convert each analog input signal to a digital code that represents the ratio of the magnitude of the analog input signal to the difference of an upper reference voltage source and a lower reference voltage source is disclosed. The upper reference voltage source is selected by an analog multiplexer from a set of voltage reference sources that include the power supply voltage source of the analog-to-digital converter for analog input signals that are reference to the power supply voltage source, and a precision reference voltage source that is referenced to the band-gap of silicon to provide an absolute measurement of the analog input signal. The lower reference voltage source is selected by a multiplexer from such references as a ground reference source.

9 Claims, 3 Drawing Sheets

MULTIPLEXED ANALOG-TO-DIGITAL CONVERTER FOR RELATIVE AND ABSOLUTE VOLTAGE MEASUREMENTS

RELATED PATENT APPLICATIONS

TMI96-011,

Title: A Method and System for Data Averaging For Pen-Input Devices, Ser. No.: 08/785,629, Filing Date: Jan. 17, 1997, Assigned to the Same Assignee as the present invention.

TMI96-012,

Title: A Command Set For Touchpad Pen-Input Mouse, Ser. No.: 08/785,726, Filing Date: Jan. 17, 1997, Assigned to the Same Assignee as the present invention.

TMI96-013,

Title: A Touchpad Pen-Input Controller, Ser. No.: 08/785,788, Filing Date: Jan. 17, 1997, Assigned to the Same Assignee as the present invention.

TMI96-014,

Title: A Touchpad Mouse Controller, Ser. No.: 08/785,724, Filing Date: Jan. 17, 1997, Assigned to the Same Assignee as the present invention..

TMI96-015

Title: A Touchpad, Pen-Input and Mouse Controller, Ser. No.: 08/785,739, Filing Date: Jan. 17, 1997, Assigned to the Same Assignee as the present invention.

TMI96-020, Inventors:

Title: Automatic Cursor Motion Control for Touch pad Mouse, Ser. No.: 08/815,033, Filing Date: Mar. 14, 1997, Assigned to the Same Assignee as the present invention.

BACKGROUND OF THE INVENTION

1. Field of the Invention

This invention relates to analog-to-digital converters and in particular to analog-to-digital converters having the ability of convert analog signals from multiple sources and having multiple voltage references.

2. Description of Related Art

Multiplexed analog-to-digital converters are well known in the art. The design of a multiplexed analog-to-digital converter has an analog multiplexer that will select one of the multiple analog input signals. The selected analog input signal is then transferred to an analog-to-digital converter circuit. The signal will be sampled periodically and held to be compared to the difference of two voltage references. Two major classifications of analog-to-digital converters are the flash analog-to-digital converter and the successive approximation analog-to-digital converter.

The flash analog-to-digital converter has the two voltage references that are connected to a voltage divider network. A comparator is connected to each individual voltage of the voltage divider network. The sampled analog input voltage is compared to the individual voltages of the voltage divider network. A digital output code is determined as the magnitude of the analog signal relative to which comparator indicates that the analog input signal has a level that is nearest the level of the voltage of the voltage divider.

The successive approximation analog-to-digital converter uses a digital-to-analog converter with binary logic such as a counter that applies a digital code to the digital-to-analog converter. The analog output of the digital-to-analog converter has an amplitude that is proportional to the difference of two references and the proportion is determined by the value of the digital code. The analog output of the digital-to-analog converter is connected to a comparator where it is compared to the sampled analog input signal. The binary logic circuit adjusts the binary code based on the value of the output of the comparator until the value of the digital code represents the magnitude of the sampled analog input signal.

The digital code will divide the difference of the voltage range between the two reference voltage sources into equal increments and each code will represent the value of each voltage increment. As an example, if the first voltage reference source equals 5.0 V and the second reference voltage source equals the ground reference potential of 0.0 V, an analog input signal equals 2.0 V, and there are ten binary bits or digits in the digital code, then:

$$V_i = \frac{V_{i1} - V_{i2}}{2^n}$$

$$= \frac{5.0 - 0.0}{2^{10}} = 4.88 \text{ mv}$$

Where:

$V_i$=magnitude of each voltage increment of the voltage divider $V_{i1}$=the magnitude of the first reference voltage source.

$V_{i2}$=the magnitude of the second reference voltage source.

n=the number of bits or binary digits in the digital code.

To interpret the value of the digital code relative to the analog input signal, the digital code (DC) will have a decimal value of:

$$DC = \frac{V_a}{V_{i1} - V_{i2}} (2^n) = \frac{2.0}{5.0 - 0.0} (2^{10}) = 410$$

Where:

$V_a$=the magnitude of the analog input signal.

If the analog input signal is determined by a circuit or transducer that is relative to the power supply voltage source, the value of the analog input signal for an equivalent physical input will vary as the value of the power supply voltage source. The voltage reference source should be derived from the power supply voltage source so that it will vary as the power supply voltage source. If on the other hand the analog input signal is the result of a physical phenomena that produces an absolute voltage, the voltage reference should be derived from a known fixed voltage source and not dependent on the fluctuations of the power supply voltage source.

U.S. Pat. No. 5,446,371 (Ecelston) describes a low resolution analog-to-digital converter and a high resolution analog-to-digital converter multiplexed to perform precision voltage measurements.

U.S. Pat. No. 5,150,120 (Yunus) shows a multiplexed sigma delta analog-to-digital converter using multiple second order sigma delta modulators multiplexed and passed through a digital low pass filter to create a digital output code.

U.S. Pat. No. 5,187,481 (Hiller) discloses a circuit where a dithering signal is added to an analog input signal and converted to a digital code the digital code for the dithering signal is then subtracted from the digital code to create an output digital code. Multiple sets of digital codes are multiplexed to increase the frequency of operation of the analog-to-digital converter circuit.

U.S. Pat. No. 4,656,585 (Stephenson) describes a flight data recorder acquisition system where data from multiple analog input signals are isolated and scaled relative a voltage reference source and applied to an analog-to-digital converter. The output of the analog-to-digital converter is transferred to a Random Access Memory for Storage.

U.S. Pat. No. 4,196,358 (Conover, et al) illustrates an analog multiplexer circuit to couple one of a plurality of analog voltage signals to an output terminal dependent on an input selection signal. The analog voltage signal is transferred to an output terminal connected to other circuitry such as an analog-to-digital converter.

SUMMARY OF THE INVENTION

An object of this invention is to provide an analog-to-digital conversion system that will alternatively select each of multiple analog input signals, sample the magnitude of analog input signal and convert each sample to a digital code representing the magnitude of the sample relative to the difference of two reference voltage sources.

Another object of this invention s to provide an analog-to-digital conversion system that will select the two reference voltage sources from a set of reference voltage sources that correspond with each of the multiple analog input signals. The set of reference voltage sources will contain relative reference voltage sources that may vary or absolute voltage sources that are fixed.

To accomplish these and other objects, an analog-to-digital conversion system has an analog input signal multiplexer to select one of the multiple analog input signals. The analog-to-digital converter system also has a first reference voltage multiplexer and a second reference voltage multiplexer to select absolute reference voltage sources or relative reference voltage sources from the set of reference voltage sources that corresponds with the selected analog input signal. Further the analog-to-digital conversion system has an analog-to-digital converter circuit that will convert the selected analog input signal to a digital code that represents the magnitude of the selected analog input signals relative to the difference of the first and second reference voltage sources.

DETAILED DESCRIPTION OF THE INVENTION

In analog control systems, transducers will convert a physical phenomena such as the voltage of a battery, the location of a pointed object on a touchpad digitizer, or the pressure response of a transducer to the pointed object pressing on a touchpad digitizer. These phenomena may create a change in a voltage, a current, or a frequency. If the phenomena causes a change in voltage, that voltage may be an absolute voltage such as that of a battery voltage as it is charging or discharging. Or it may be a change in resistance in a voltage divider network where the voltage is relative to the power supply voltage source.

Figure 1:
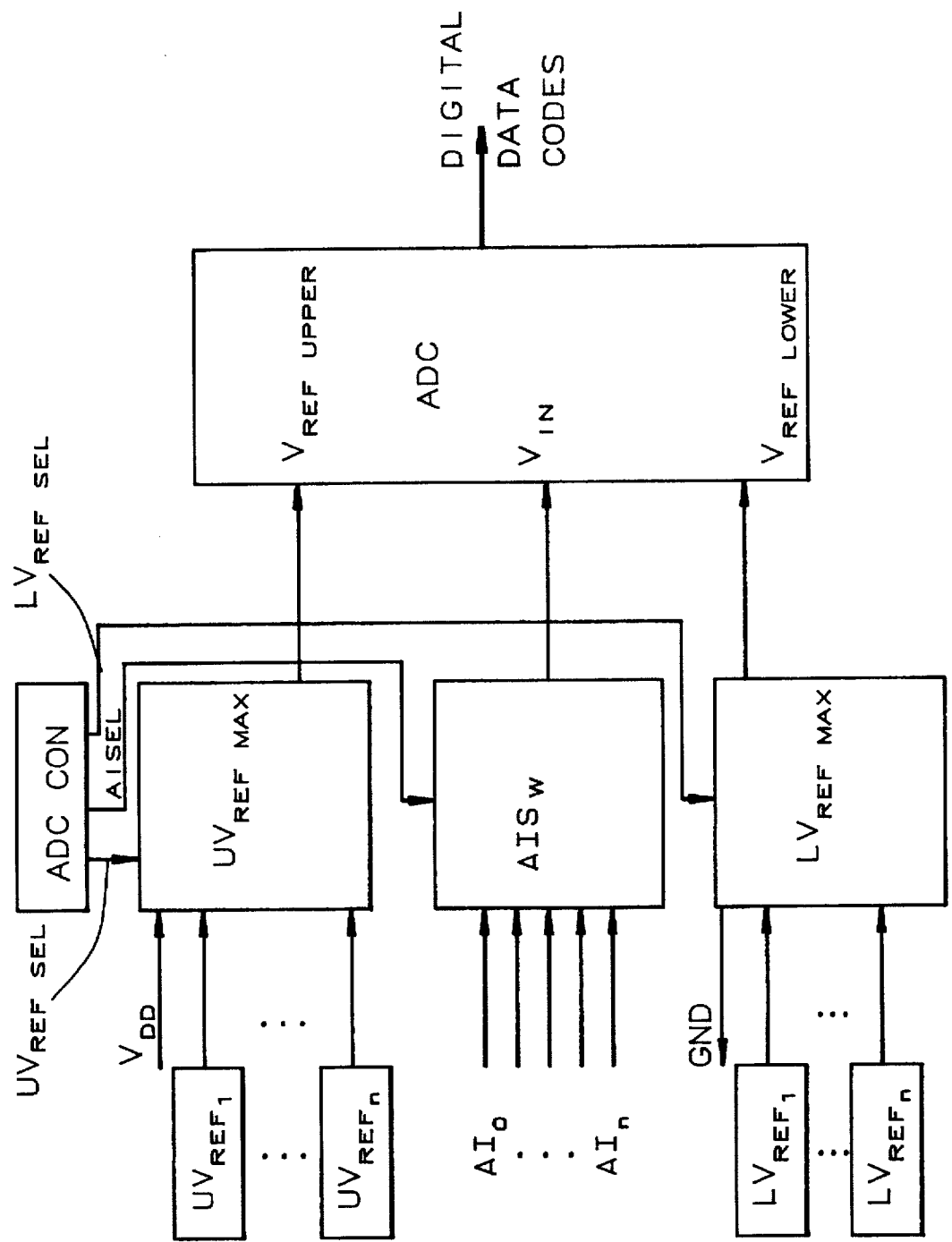
FIG. 1 is a block diagram of an analog-to-digital conversion system of this invention.

To convert the physical response from multiple transducers having different references, a multiplexed analog-to-digital converter will select the reference as well as the analog input signal from the transducer. FIG. 1 shows a multiplexed analog-to-digital converter of this invention.

A first plurality of reference voltage sources $V_{DD}$, $UVref_1, \ldots, UVref_n$ are connected to an upper reference voltage multiplexer UVrefMux. A second plurality of reference voltage sources GND, $LVref_1, \ldots, LVref_n$ are connected to a lower reference voltage multiplexer LVrefMux. Multiple analog input signals $AI_0, \ldots, AI_n$ are connected to an analog switch AISw. The analog-to-digital converter control will condition the analog input select signal AISel to choose one of the analog input signals $AI_0, \ldots, AI_n$ to be coupled to the input $V_{in}$ of the analog-to-digital converter ADC. Simultaneously, the analog-to-digital converter control will condition the reference voltage select lines UVrefSel and LVrefSel to couple the reference voltage source that corresponds with the selected analog input signal $AI_0, \ldots, Ai_n$ to the reference voltage nodes $V_{ref\,upper}$ and $V_{ref\,lower}$ of the analog-to-digital converter ADC. The analog-to-digital converter then samples the input voltage $V_{in}$, compares it to the difference of the upper reference voltage node $V_{ref\,upper}$ and the lower reference voltage node $V_{ref\,lower}$, and converts comparison to the Digital Data Codes that represent the magnitude of the selected analog input signal relative to the difference of the upper and lower reference voltage nodes $V_{ref\,upper}$ and $V_{ref\,lower}$. The Digital Data Codes are then transferred to external circuitry for further processing.

In situations wherein any of the analog input signals $AI_0, \ldots, AI_n$ are referenced relative to the power supply voltage source $V_{dd}$ or a voltage source that is referenced or controlled by the power supply voltage source $V_{dd}$, the reference voltage sources $V_{DD}$, $UVref_1, \ldots, UVref_n$ and GND, $LVref_1, \ldots, LVref_n$ are chosen such that they will vary relative to the power supply voltage source $V_{dd}$. However, in situations wherein any of the analog input signals $AI_0, \ldots, AI_n$ are referenced to voltages that have an absolute, non varying value, the reference voltage sources $UVref_1, \ldots, UVref_n$ and $LVref_1, \ldots, LVref_n$ are chosen such that they will vary relative to or controlled by this absolute value. Often the absolute voltage chosen will be a reference voltage source referenced to the bandgap of silicon.

Figure 2A:
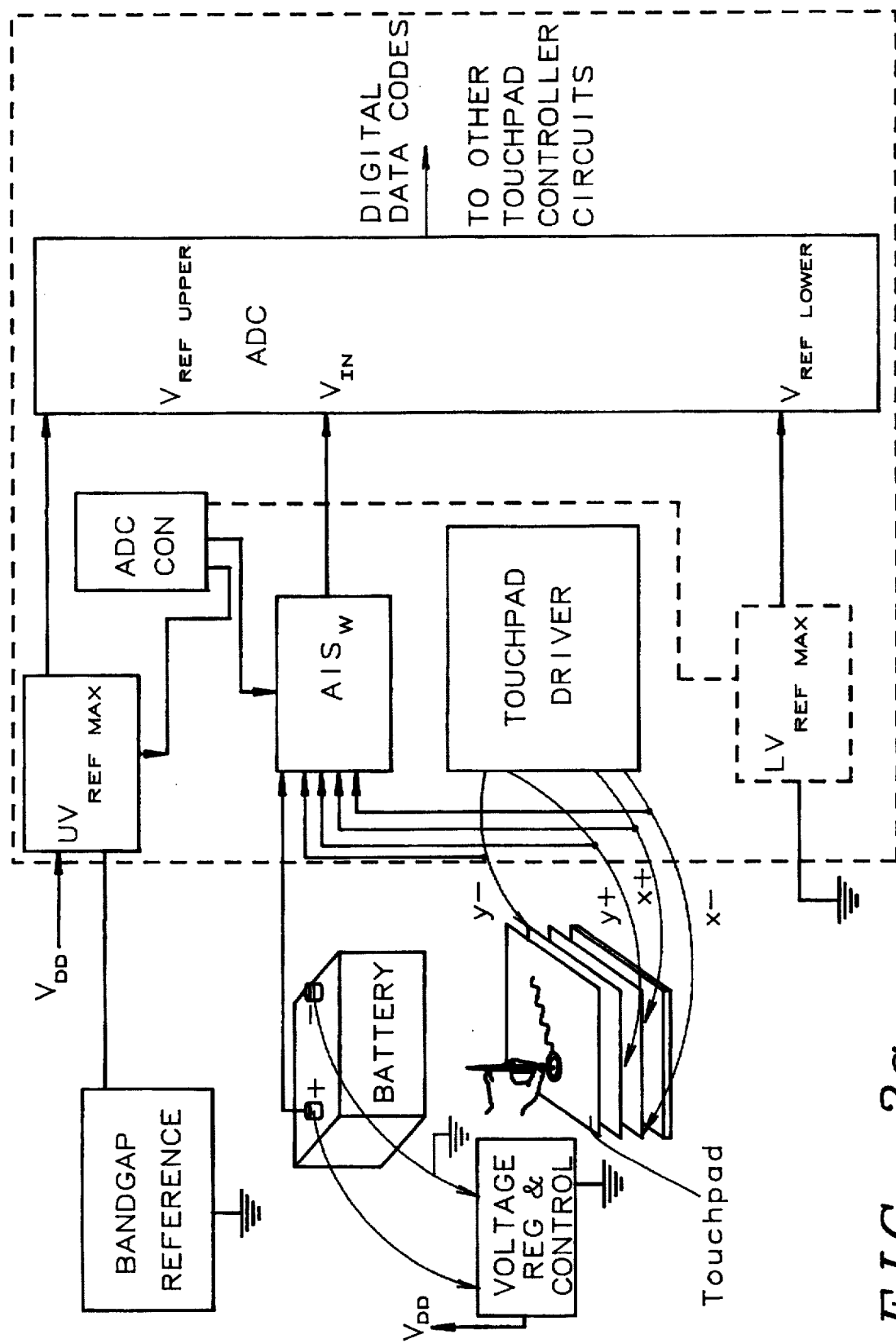
FIG. 2a is a schematic block diagram of an application of this invention.

FIG. 2a is an example of an application of a multiplexed analog-to-digital converter of this invention. A touchpad controller has a touchpad driver to provide a stimulus to a resistive touchpad.

The resistive touchpad is made up of multiple layers of resistive films and protective layers. A protective hard coating is the surface onto which a pointed object such as a pen, stylus, or a finger is pressed. A first layer of resistive film is attached to the protective hard coating on the surface opposite the writing surface. This first layer of resistive film forms the Y-plane of the touchpad. Attached to the surface of the Y-plane resistive film opposite the surface attached to the hard protective coatings a second resistive film. This second resistive film forms the X-plane of the touchpad. Finally attached to the side of the X-plane resistive film is a supporting back layer. This back layer provides protection and mechanical support for the for the X-plane and Y-plane resistive films.

The touchpad driver is connected through the touchpad interface lines X+, X−, Y+, and Y−. Each line will provide a stimulus such as a current or voltage to the periphery of the X-plane resistive film and the Y-plane resistive film. As the pointed object is pressed on the touchpad surface, the Y-plane resistive film will deform and touch the X-plane resistive film. The X-plane resistive film can not deform because it is supported by the supporting back layer. This causes the Y-plane resistive film and the X-plane resistive film to come into contact with each other. This will cause a response in the form of a change in voltage on the interface lines X+, X−, Y+, and Y−.

Figure 2B:
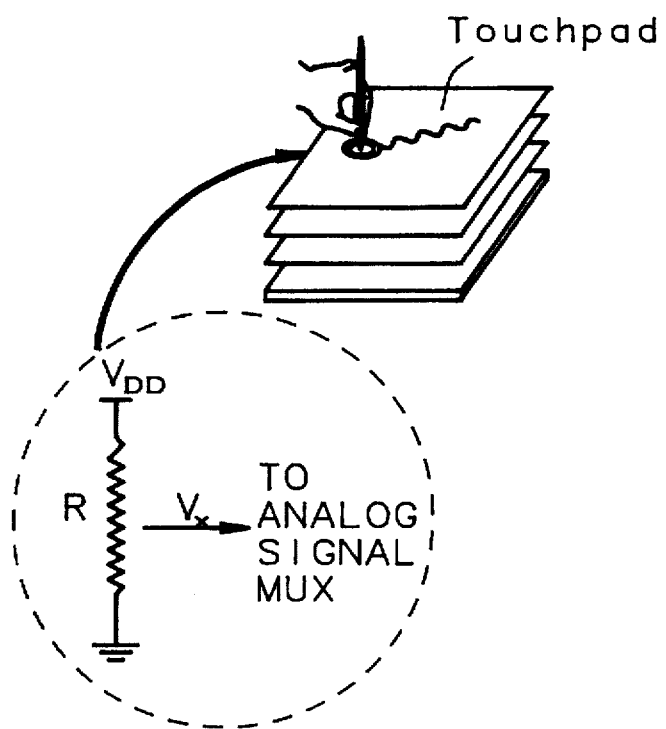
FIG. 2b shows an equivalent circuit of a touchpad of the invention.

An equivalent circuit for one of the planes of the touchpad is shown in FIG. 2b. The touchpad will have the power supply source $V_{DD}$ and the ground reference voltage source GND periodically connected respectively to the interface lines X+, X−, Y+, and Y− to the X-plane and then to the Y-plane of the touchpad. When the pointed object is placed upon the touchpad, the $V_x$ is applied to the input of the analog switch AlSw. The voltage $V_x$ is proportional to the magnitude of the power supply voltage source $V_{DD}$ with respect to the ground reference voltage supply GND. The power supply voltage source $V_{DD}$ may vary with the load, the temperature, usage over time, and the distribution of the power supply voltage.

Returning to FIG. 2a, in portable computing applications, the touchpad controller will have the power supply voltage source $V_{DD}$ developed from a battery. In order to monitor the condition of the battery, the positive terminal + is connected to the analog switch AlSw to monitor the voltage of the battery. The battery voltage will be an absolute value and needs to be referenced to an absolute reference voltage source, such as a band-gap referenced voltage source. An absolute reference voltage source such as the band-gap referenced voltage source is constant and does not vary with factors such as temperature or the power supply voltage source $V_{DD}$. This will allow a precise measurement of the battery voltage.

The analog-to-digital converter control ADCCon will select which analog input X+, X−, Y+, Y−, or Battery is to be applied to the input node $V_{in}$ of the analog-to-digital converter ADC by conditioning the analog input select lines AlSel. The analog-to-digital converter control ADCCon will simultaneously select between the power supply voltage source $V_{DD}$ or the Band-gap Reference to be applied to the upper reference voltage node $V_{ref\ upper}$ through the upper reference voltage multiplexer $UV_{ref}Mux$. Since all the reference voltage sources are referenced to the ground reference voltage source GND, The ground reference voltage source is connected directly to the lower reference voltage node $V_{ref\ lower}$ and the lower reference voltage multiplexer $LV_{ref\ lower}$ is omitted.

The signals from the touchpad applied to the interface lines X+, X−, Y+, and Y− will be referenced relative to the power supply voltage source $V_{DD}$ and will produce the digital data codes that are relative to the power supply voltage source $V_{DD}$ regardless of the variations. The battery will be referenced to the absolute reference voltage source that is the Band-gap reference which will produce digital data codes that have a value that is absolute and do not change with factors such as temperature or the power supply voltage source $V_{DD}$ variations.

While this invention has been particularly shown and described with reference to the preferred embodiments thereof, it will be understood by those skilled in the art that various changes in form and details may be made without departing from the spirit and scope of the invention.

What is claimed is:

1. A multiplexed analog-to-digital conversion system to accept a plurality of dissimilar analog signals and convert said analog signals to an output digital codes that represent the magnitude of each of the dissimilar analog signals as compared to a voltage difference of an upper voltage reference node and a lower voltage reference node, comprising:

a) an analog signal multiplexer having a plurality of input nodes each connected to each of the plurality of dissimilar analog signals, a plurality of signal selection nodes to receive an analog signal select code, and an output node that will contain one of the plurality of dissimilar analog signals as determined by the analog signal select code;

b) a first voltage reference multiplexer having a first output connected to the upper reference voltage node, a plurality of voltage input nodes connected to a plurality of reference voltage sources, a plurality of upper reference voltage selection nodes to receive an upper reference voltage selection code, wherein one of the plurality of reference voltage sources is coupled to said output node dependent on said upper reference voltage selection code;

c) a second voltage reference multiplexer having a second output connected to the lower reference voltage node, a plurality of voltage input nodes connected to the plurality of reference voltage sources, a plurality of lower reference voltage selection nodes to receive an lower reference voltage selection code, wherein one of the plurality of reference voltage sources is coupled to said output node dependent on said lower reference voltage selection code;

d) an analog-to-digital converter circuit connected to the upper voltage reference node, the lower reference voltage node, and the output node of the analog signal multiplexer to compare a selected analog signal of the plurality of dissimilar analog signals to the difference of the upper reference voltage node and the lowered reference voltage node to create the output digital codes; and e) a analog-to-digital converter control means to create the analog signal select code, the upper reference voltage select code, and the lower reference voltage signal select code, wherein said analog-to-digital converter control means will associate each of the plurality of dissimilar analog signals with appropriate reference voltages from the plurality of reference voltage sources.

2. The analog-to-digital conversion system of claim 1 wherein the plurality of upper reference voltage sources is selected from a set of voltage sources comprising a power supply voltage source, and a band-gap referenced voltage source.

3. The analog-to-digital conversion system of claim 2 wherein in the plurality of lower reference voltage sources is selected from the set of voltage sources further comprising a ground reference voltage source.

4. The analog-to-digital conversion system of claims 3 wherein if the upper voltage reference source is the band-gap referenced voltage source and the lower voltage reference source is the ground reference voltage source, a selected analog input signal of the plurality of dissimilar analog input signals will produce said output digital code that represent an absolute magnitude of the selected analog input signal and will be insensitive to changes in environmental factors such as fluctuations in magnitude of the power supply voltage source or temperature.

5. The analog-to-digital conversion system of claims 3 wherein if the upper voltage reference source is the power supply voltage source and the lower voltage reference source is the ground reference voltage source, a selected analog input signal of the plurality of dissimilar analog input signals will produce said output digital code that represent a relative magnitude of the selected analog input signal and will change as the power supply voltage source changes due to factors such as loading, temperature, usage over time, and distribution of said power supply voltage source.

6. An analog-to-digital converter means to convert an analog input signal selected from a plurality of dissimilar analog signals to a digital code that represents the magnitude of said analog input signal as compared to a difference between a first reference voltage source and second reference voltage source, comprising:

- a) an analog input signal selection means comprising a plurality of analog input ports to receive the plurality of dissimilar analog signals, an output port, and a port selection means to couple one of the plurality of input ports to the output port;
- b) a first reference voltage selection means to select one of a plurality of reference voltage sources as the first reference voltage source;
- c) a second reference voltage selection means to select one of a plurality of reference voltage sources as the second reference voltage source;
- d) an analog-to-digital converter means connected to the output port of the analog input selector to convert the analog input signals to the digital code and to transfer said digital code to external circuitry, and
- e) a analog-to-digital converter controller to provide selection signals to the analog input signal selector and the first and second reference voltage selection means to command which of the plurality of analog input signals and the plurality of voltage references are to be chosen.

7. The analog-to-digital converter means of claim 6 wherein the plurality of reference voltage sources comprises a power supply voltage source, a band-gap referenced voltage source, and a ground reference voltage source.

8. The analog-to-digital converter means of claim 6 wherein if the upper voltage reference source is the band-gap referenced voltage source and the lower voltage reference source is the ground reference voltage source, a selected analog input signal of the plurality of dissimilar analog input signals will produce said output digital code that represent an absolute magnitude of the selected analog input signal and will be insensitive to changes in environmental factors such as fluctuations in magnitude of the power supply voltage source or temperature.

9. The analog-to-digital converter means of claim 6 wherein if the upper voltage reference source is the power supply voltage source and the lower voltage reference source is the ground reference voltage source, a selected analog input signal of the plurality of dissimilar analog input signals will produce said output digital code that represent a relative magnitude of the selected analog input signal and will change as the power supply voltage source changes due to factors such as loading, temperature, usage over time, and distribution of said power supply voltage source.

* * * * *

UNITED STATES PATENT AND TRADEMARK OFFICE
CERTIFICATE OF CORRECTION

PATENT NO. : 5,736,949
DATED : 4/7/98
INVENTOR(S) : Eng Yue Ong, Xia, Geng, Swee Hock Alvin Lim It is certified that error appears in the above-indentified patent and that said Letters Patent is hereby corrected as shown below:

On the Cover Page, at (75), delete "Liw Sioee" and replace with --Lim Swee--.

Signed and Sealed this

Fifth Day of January, 1999

Attest:

Attesting Officer

Acting Commissioner of Patents and Trademarks